United States Patent
Koike et al.

(10) Patent No.: US 9,813,062 B2
(45) Date of Patent: Nov. 7, 2017

(54) FINFET BASED DRIVER CIRCUIT

(71) Applicant: SOCIONEXT INC., Yokohama-shi, Kanagawa (JP)

(72) Inventors: Tsuyoshi Koike, Shiga (JP); Yasuhiro Agata, Osaka (JP); Yoshinobu Yamagami, Osaka (JP)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 15/080,406

(22) Filed: Mar. 24, 2016

(65) Prior Publication Data
US 2016/0211839 A1    Jul. 21, 2016

Related U.S. Application Data

(63) Continuation of application No. PCT/JP2014/002281, filed on Apr. 23, 2014.

(30) Foreign Application Priority Data

Sep. 27, 2013 (JP) .................................. 2013-201060

(51) Int. Cl.
*H03K 17/12* (2006.01)
*H03K 19/017* (2006.01)
(Continued)

(52) U.S. Cl.
CPC ..... *H03K 19/01721* (2013.01); *H03K 17/122* (2013.01); *H03K 19/094* (2013.01);
(Continued)

(58) Field of Classification Search
CPC ...... H03K 17/12; H03K 17/122; H03K 19/01; H03K 19/017; H03K 19/01707; H03K 19/01721; H03K 19/094
(Continued)

(56) References Cited

U.S. PATENT DOCUMENTS 4,533,841 A * 8/1985 Konishi ........... H03K 19/09425
326/38
4,612,466 A * 9/1986 Stewart ............ H03K 19/01721
326/82
(Continued)

FOREIGN PATENT DOCUMENTS

JP    H04-371023 A    12/1992
JP    H09-27554 A     1/1997
(Continued)

OTHER PUBLICATIONS

International Search Report dated Jul. 22, 2014, issued in related International Application No. PCT/JP2014/002281 with an international filed of Apr. 23, 2014 (English Translation provided).
(Continued)

*Primary Examiner* — William Hernandez
(74) *Attorney, Agent, or Firm* — McDermott Will & Emery LLP

(57) ABSTRACT

Disclosed herein is a driver circuit including a first group of transistors provided between first and second nodes and including n of the transistor(s) where n is equal to or greater than one, and a second group of transistors provided in parallel with the first group of transistors and including m of the transistor(s) where m is equal to or greater than one and not equal to n, the m transistors being connected together in series. The n-channel transistor in the first group and at least one of the two n-channel transistors in the second group have their gate connected to an input node.

7 Claims, 15 Drawing Sheets

(51) Int. Cl.
*H03K 19/094* (2006.01)
*H03K 19/0952* (2006.01)
*H01L 21/00* (2006.01)
*H01L 29/00* (2006.01)

(52) U.S. Cl.
CPC .............. *H01L 21/00* (2013.01); *H01L 29/00* (2013.01); *H03K 19/0952* (2013.01)

(58) Field of Classification Search
USPC .................. 326/82, 83, 87; 327/108, 109
See application file for complete search history.

(56) References Cited

U.S. PATENT DOCUMENTS

| | | | | |
|---|---|---|---|---|
| 5,059,835 A | * | 10/1991 | Lauffer | H03K 17/302 326/35 |
| 5,495,187 A | * | 2/1996 | Martin | H03K 19/00384 326/24 |
| 5,732,027 A | * | 3/1998 | Arcoleo | G11C 7/1057 365/189.05 |
| 5,801,548 A | * | 9/1998 | Lee | H03K 19/0027 326/33 |
| 6,147,513 A | * | 11/2000 | Bui | H03K 19/0027 326/83 |
| 6,642,090 B1 | * | 11/2003 | Fried | H01L 21/82382 257/E21.635 |
| 7,557,618 B1 | * | 7/2009 | Wik | H03K 19/0948 326/121 |
| 7,839,200 B2 | * | 11/2010 | Im | G11C 7/04 327/170 |
| 2005/0026377 A1 | | 2/2005 | Kawasaki et al. | |
| 2007/0090468 A1 | | 4/2007 | Kawasaki et al. | |
| 2009/0167413 A1 | * | 7/2009 | Im | G11C 7/04 327/512 |

FOREIGN PATENT DOCUMENTS

| | | |
|---|---|---|
| JP | 2001-127593 A | 5/2001 |
| JP | 2005-064459 A | 3/2005 |
| JP | 2007-235037 A | 9/2007 |

OTHER PUBLICATIONS

Written Opinion dated Jul. 22, 2014, issued in related International Application No. PCT/JP2014/002281 with an international filing date of Apr. 23, 2014 (Partial English Translation provided).

* cited by examiner

FINFET BASED DRIVER CIRCUIT

CROSS-REFERENCE TO RELATED APPLICATIONS

This is a continuation of International Application No. PCT/JP2014/002281 filed on Apr. 23, 2014, which claims priority to Japanese Patent Application No. 2013-201060 filed on Sep. 27, 2013. The entire disclosures of these applications are hereby incorporated by reference.

BACKGROUND

The present disclosure relates to a semiconductor integrated circuit device including a transistor having a fin structure.

It is known in the art that when a semiconductor integrated circuit is designed, the drivability of a transistor is controllable by adjusting the gate width and/or length of the transistor and/or changing the number of transistors connected in parallel to the transistor.

Japanese Unexamined Patent Application Publication No. H09-27554 discloses a semiconductor electronic circuit designed such that its drivability is controllable by arranging a plurality of transistors having different gate lengths or widths, selecting some transistors from these transistors depending on the necessity, and connecting such selected transistors together.

Recently, it has been proposed to utilize transistors with a fin structure (hereinafter referred to as "fin transistors") in the field of semiconductor devices. FIG. 15 schematically illustrates a fin transistor. Unlike a metal oxide semiconductor (MOS) transistor having a two-dimensional structure, its source and drain have a raised, three-dimensional structure called a "fin." Its gate is disposed so as to wrap around a channel region defined between the source and drain in this fin. In this fin structure, the channel region is defined by three surfaces of the fin, thereby improving channel controllability significantly compared to conventional ones. As a result, various advantages, including reducing the leakage power, increasing the ON-state current, and lowering the operating voltage, are achieved. This leads to improving the performance of semiconductor integrated circuits.

SUMMARY

In a semiconductor fine patterning process, the uniformity in characteristics and the yield of devices to be fabricated are significantly affected by, e.g., the shape of the gate and/or diffusion layer of a transistor and/or the shape of its wiring pattern. Among other things, fin transistors have their characteristics significantly affected by the width of their fins. It is thus recommended to design the circuit with fin transistors having uniform gate width and length.

On the other hand, if a semiconductor integrated circuit is designed such that transistors have a fixed gate width and a fixed gate length, the number of the transistors connected together in parallel may be increased or decreased, for example, to increase or decrease the drivability of the transistors. However, the possible drivability value of the transistors in such a case is limited to a value obtained by an integral multiplication of the number of transistors having the minimum drivability. As a result, this disadvantageously decreases the degree of flexibility in designing the circuit, and may eventually cause a decline in the performance of the circuit.

In view of the foregoing background, it is therefore an object of the present disclosure to provide a technique for easily controlling the drivability of a semiconductor integrated circuit including fin transistors to any desired level.

A first aspect of the present disclosure provides a semiconductor integrated circuit connected to an input node and first and second nodes, and having a plurality of transistors, each of which has a first channel conductivity type and which are configured as fin transistors having the same gate length and the same gate width. The plurality of transistors includes: a first group of transistors provided between the first and second nodes and including n of the transistor(s) where n is an integer equal to or greater than one, the n transistors being connected together in series; and a second group of transistors provided between the first and second nodes in parallel with the first group of transistors and including m of the transistor(s) where m is an integer equal to or greater than one and not equal to n, the m transistors being connected together in series. At least one of the n transistor(s) in the first group and at least one of the m transistor(s) in the second group have their gate connected to the input node.

A second aspect of the present disclosure provides a semiconductor integrated circuit device comprising a plurality of the semiconductor integrated circuits. The plurality of semiconductor integrated circuits includes a first semiconductor integrated circuit configured as the semiconductor integrated circuit of the first aspect.

According to the first and second aspects, a semiconductor integrated circuit includes a first group of transistors including n transistor(s) connected together in series and a second group of transistors including m transistor(s) connected together in series, the first and second groups of transistors being connected together in parallel. The number of the transistors connected together in series in the first group is different from in the second group. At least one of the transistors in each of the first and second groups has its gate connected to an input node. This allows for controlling the ON/OFF states of these two groups of transistors in response to an input signal supplied from the input node. Accordingly, adjusting the number of the transistors (n and m) that form each of the first and second groups allows for providing a semiconductor integrated circuit with a desired degree of drivability. Furthermore, this allows for increasing the degree of flexibility in designing a semiconductor integrated circuit and a device including the circuit, and eventually improving the performance thereof.

The present disclosure allows a semiconductor integrated circuit to have a desired degree of drivability by connecting multiple groups of transistors, each of which includes one or more series-connected transistors, together in parallel, and forming at least one of the groups of a different number of the transistors from the other groups.

DETAILED DESCRIPTION

Embodiments of the present disclosure will now be described in detail with reference to the accompanying drawings. Note that description of any element performing substantially the same function as its counterpart already described may be omitted herein to avoid redundancies. The present disclosure will be described on the supposition that, in order to allow the reader to understand the invention easily, the drivability of a circuit where k transistors (k≥1) with the same drivability are connected together in series is 1/k that of the transistors. In an actual semiconductor integrated circuit, however, its drivability may be different from 1/k of that of the transistors.

First Embodiment

Figure 1:
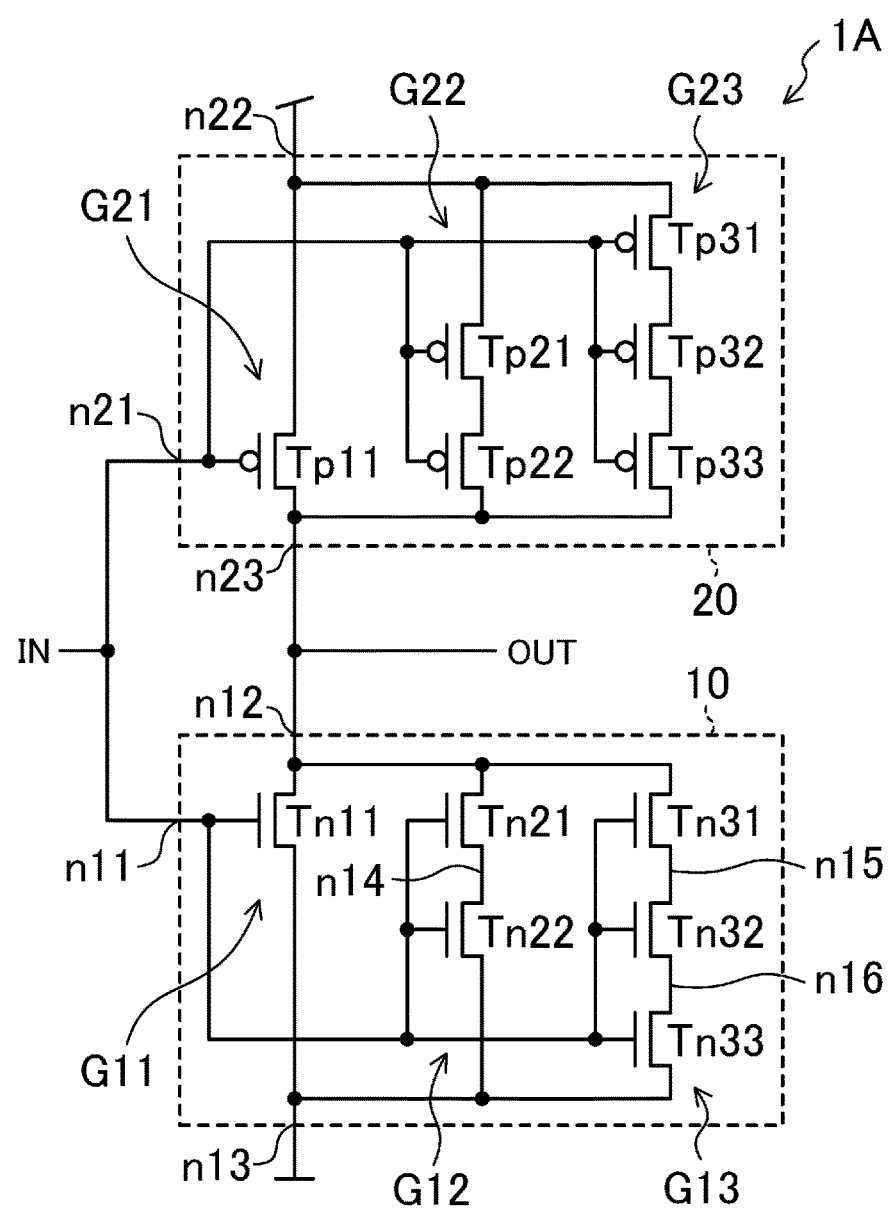
FIG. 1 conceptually illustrates an exemplary circuit configuration of a semiconductor integrated circuit device according to a first embodiment.

FIG. 1 conceptually illustrates an exemplary circuit configuration of a semiconductor integrated circuit device 1A according to a first embodiment.

As illustrated in FIG. 1, the semiconductor integrated circuit device 1A is configured as an inverter circuit including driver circuits 10 and 20 functioning as semiconductor integrated circuits.

The driver circuit 10 is provided between a node n12 connected to an output node OUT and functioning as a first node, and a node n13 connected to the ground and functioning as a second node. The driver circuit 10 includes transistor groups G11, G12 and G13 connected together in parallel with each other and each functioning as a first or second group of transistors.

The transistor group G11 includes an n-channel transistor Tn11 connected between the nodes n12 and n13. The gate of the n-channel transistor Tn11 is connected to an input node n11 that is further connected to an input node IN.

The transistor group G12 includes two n-channel transistors Tn21 and Tn22 connected together in series between the nodes n12 and n13. The respective gates of the two n-channel transistors Tn21 and Tn22 are both connected to the input node n11.

The transistor group G13 includes three n-channel transistors Tn31, Tn32, and Tn33 connected together in series between the nodes n12 and n13. The respective gates of the three n-channel transistors Tn31, Tn32, and Tn33 are all connected to the input node n11.

In this embodiment, the n-channel transistors Tn11, Tn21, Tn22, and Tn31-Tn33 are supposed to be transistors each configured as a fin transistor. Also, the fin transistors constituting the respective transistors are supposed to have the same gate length and the same gate width. That is to say, the n-channel transistors Tn11, Tn21, Tn22, and Tn31-Tn33 have the same drivability (the same applies to the other drawings).

Note that, in the present disclosure, when we say "the transistors have the same gate length or the same gate width," it means that the transistors have substantially the same gate length or the same gate width, i.e., their lengths or widths may be slightly different from each other due to some error involved with the manufacturing process. Likewise, in the present disclosure, when we say "the transistors have the same drivability," it means that the transistors have substantially the same drivability, i.e., their drivabilities may be slightly different from each other due to some error involved with the manufacturing process.

The driver circuit 20 includes transistor groups G21, G22, and G23 connected together in parallel between a node 22 connected to a power supply and a node 23 connected to the output node OUT and each functioning as a first or second group of transistors.

The transistor group G21 includes a p-channel transistor Tp11 connected between the nodes n22 and n23. The gate of the p-channel transistor Tp11 is connected to an input node n21 that is further connected to the input node IN.

The transistor group G22 includes two p-channel transistors Tp21 and Tp22 connected together in series between the nodes n22 and n23. The respective gates of the two p-channel transistors Tp21 and Tp22 are both connected to the input node n21.

The transistor group G23 includes three p-channel transistors Tp31, Tp32, and Tp33 connected together in series between the nodes n22 and n23. The respective gates of the three p-channel transistors Tp31, Tp32, and Tp33 are all connected to the input node n21.

In this embodiment, the p-channel transistors Tp11, Tp21, Tp22, and Tp31-Tp33 are supposed to be transistors each configured as a fin transistor. Also, the fin transistors constituting the respective transistors are supposed to have the same gate length and the same gate width. That is to say, the p-channel transistors Tp11, Tp21, Tp22, and Tp31-Tp33 have the same drivability (the same applies to the other drawings).

In the transistor group G12 of the driver circuit 10, the two n-channel transistors Tn21 and Tn22 are connected together in series. The drivability of the transistor group G12 is thus half that of the transistor group G11. Likewise, the drivability of the transistor group G13 is one-third that of the transistor group G11. Accordingly, the drivability of the driver circuit 10 where the three transistor groups G11, G12, and G13 are connected together in parallel is about 1.8 (=1+½+⅓) times as high as that of the n-channel transistor Tn11.

Likewise, the drivability of the driver circuit 20 where the three transistor groups G21, G22, and G23 are connected together in parallel is about 1.8 times as high as that of the p-channel transistor Tp11.

As can be seen, according to this embodiment, by providing a plurality of transistor groups, comprised of respectively different numbers of series-connected transistors, and connecting such transistor groups together in parallel, a driver circuit (a semiconductor integrated circuit) with a desired degree of drivability is provided. As a result, this allows for increasing the degree of flexibility in designing the driver circuit, and improving the performance of the driver circuit and a semiconductor integrated circuit including such a driver circuit.

In FIG. 1, an intermediate node n14 between the n-channel transistors Tn21 and Tn22 in the transistor group G12, an intermediate node n15 between the n-channel transistors Tn31 and Tn32 in the transistor group G13, and/or an intermediate node n16 between the n-channel transistors Tn32 and Tn33 in the transistor group G13 may be connected together. Even in such a situation, the same or similar advantage may also be achieved as long as the output node OUT is driven by transistor groups having respectively different numbers of series-connected transistors.

In the example illustrated in FIG. 1, the three transistor groups G11, G12, and G13 in the driver circuit 10 have respectively different numbers of series-connected transistors. However, as illustrated in FIG. 2, multiple (two in FIG. 2) transistor groups G11 and G11 (first and third groups of transistors) comprised of the same number of transistors may be connected in parallel to the transistor group G12 (a second group of transistors) comprised of a different number of series-connected transistors from the transistor group G11.

Figure 2:
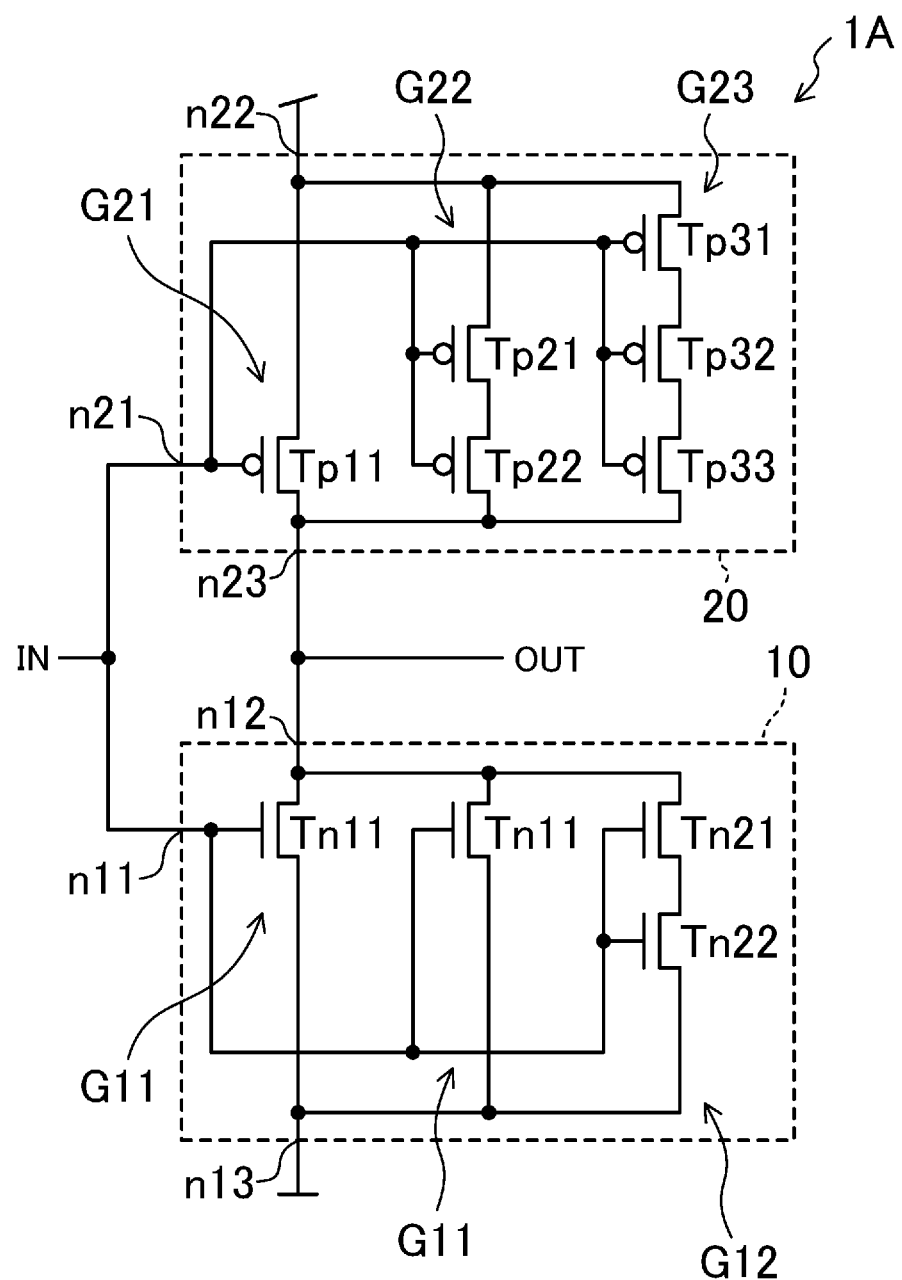
FIG. 2 conceptually illustrates another exemplary circuit configuration of a semiconductor integrated circuit device according to the first embodiment.

Specifically, as illustrated in FIG. 2, the two transistor groups G11 and G11 each include the n-channel transistor Tn11 connected between the nodes n12 and n13. Both of these n-channel transistors Tn11 have their gate connected to the input node n11.

As in FIG. 1, the drivability of the transistor group G12 in FIG. 2 is half that of the transistor group G11. Accordingly, the drivability of the driver circuit 10 where the three transistor groups G11, G11, and G12 are connected together in parallel is 2.5 times as high as that of the n-channel transistor Tn11.

Such a driver circuit, of which the drivability is 2.5 times as high as that of the n-channel transistor Tn11, may also be implemented by connecting together in parallel five transistor groups, each comprised of two series-connected n-channel transistors Tn11. Nevertheless, as illustrated in FIG. 2, the configuration of this embodiment allows the driver circuit to be implemented in a smaller area.

Figure 3:
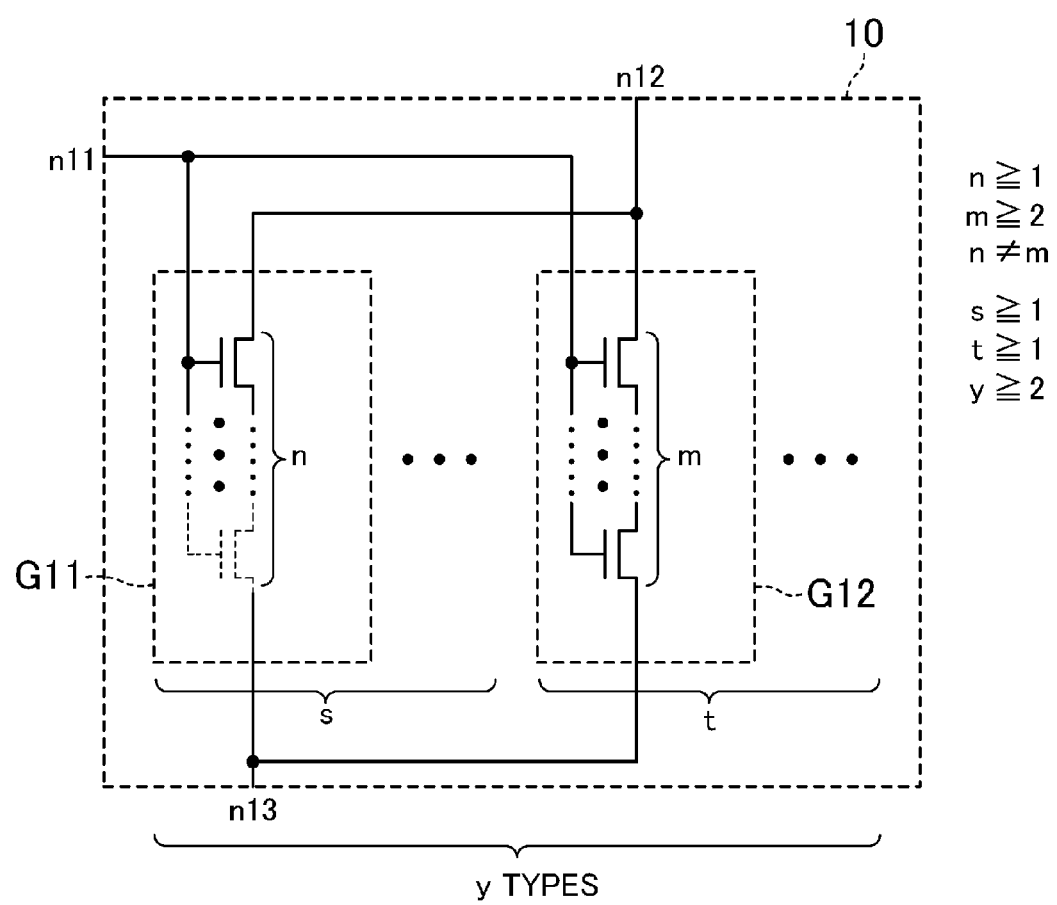
FIG. 3 schematically illustrates a configuration of a driver circuit.

FIG. 3 schematically illustrates the configuration of the driver circuit 10 according to this embodiment.

As illustrated in FIG. 3, the driver circuit 10 includes s transistor groups G11 (where s≥1) each comprised of n n-channel transistors (where n≥1) connected together in series, the s transistor groups G11 being connected together in parallel between the nodes n12 and n13. The driver circuit 10 further includes t transistor groups G12 (where t≥1) each comprised of m n-channel transistors (where m≥2 and m≠n) connected together in series, the t transistor groups G12 being connected together in parallel between the nodes n12 and n13. The driver circuit 10 includes y types of transistor groups (where y≥2) (for example, the transistor groups G11 and G12) comprised of mutually different numbers of series-connected transistors as described above. The y types of the transistor groups are connected together in parallel between the nodes n12 and n13.

In the example illustrated in FIG. 3, the driver circuit 10 includes n-channel transistors as transistors of the same channel conductivity type. The driver circuit 20 including p-channel transistors as transistors of the same channel conductivity type may also be implemented in the same or similar manner.

Figure 4:
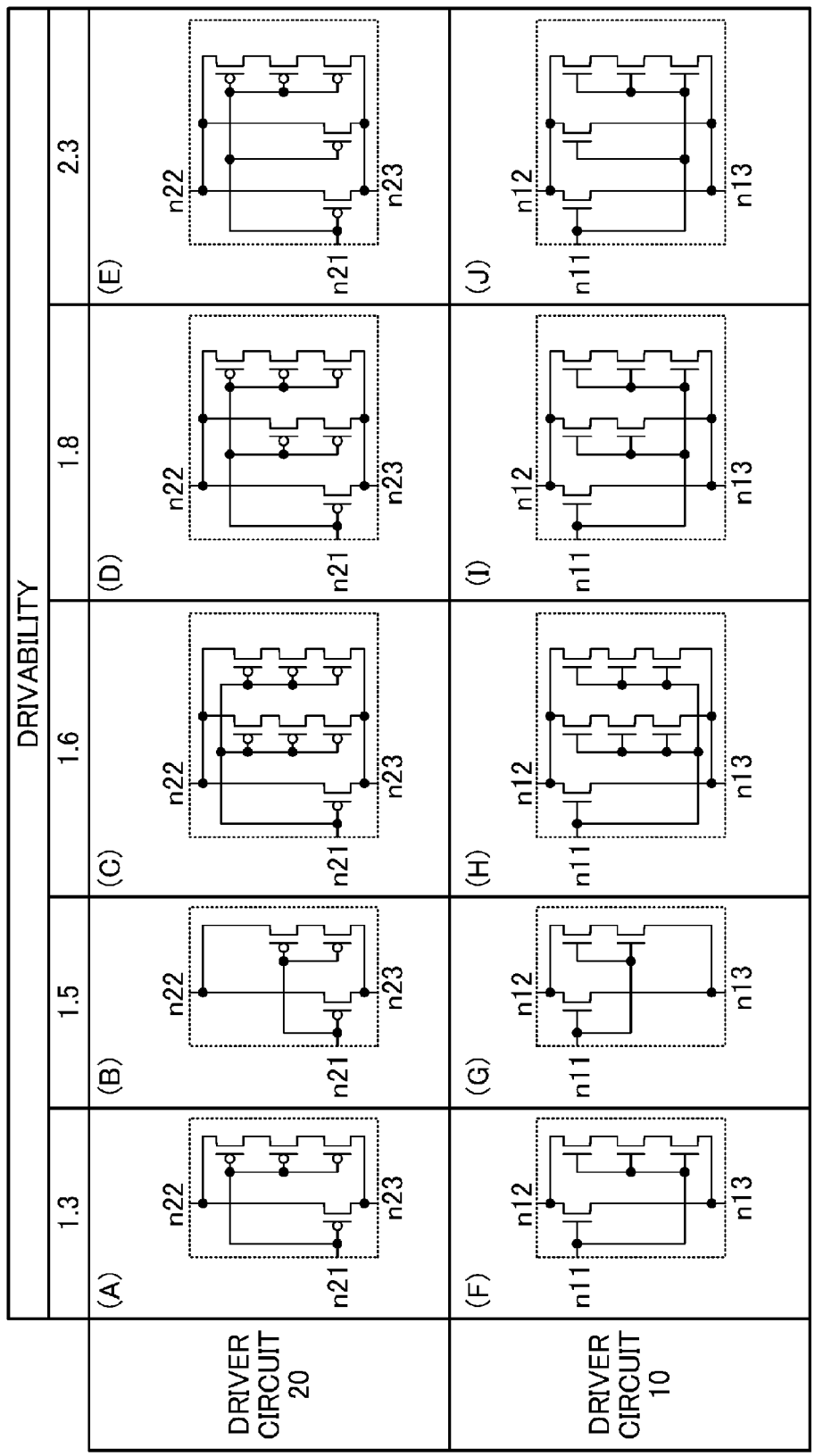
FIG. 4 illustrates examples of driver circuits and their drivabilities.

FIG. 4 illustrates, in the form of a table, specific examples of the driver circuits 10 and 20 implemented based on the configuration shown in FIG. 3 and their drivabilities. In this table, all of the n-channel transistors in the driver circuit 10 are supposed to have the same degree of drivability. Likewise, all of the p-channel transistors in the driver circuit 20 are supposed to have the same degree of drivability. Each numerical value shown in this table indicates how many times the drivability of the driver circuit is higher than that of a single n-channel or p-channel transistor.

As illustrated in FIG. 4, circuit configurations (A) and (F) illustrate exemplary circuit configurations where n=1, s=1, m=3, t=1, and y=2 in FIG. 3, and its drivability is about 1.3 times as high as that of a single n-channel or p-channel transistor.

Likewise, circuit configurations (B) and (G) illustrate exemplary circuit configurations where n=1, s=1, m=2, t=1, and y=2, and its drivability is about 1.5 times as high as that of a single n-channel or p-channel transistor. Circuit configurations (C) and (H) illustrate exemplary circuit configurations where n=1, s=1, m=3, t=2, and y=2, and its drivability is about 1.6 times as high as that of a single n-channel or p-channel transistor. Circuit configurations (D) and (I) illustrate exemplary circuit configurations where n=1, s=1, m=2, t=1, and y=3, and its drivability is about 1.8 times as high as that of a single n-channel or p-channel transistor. Specifically, in the circuit configurations (D) and (I), a third group of transistors comprised of three p-channel transistors ((D) of FIG. 4) or three n-channel transistors ((I) of FIG. 4) connected together in series is connected in parallel to the transistor groups included in each of the circuit configurations (B) and (G). Circuit configurations (E) and (J) illustrate an exemplary circuit configuration where n=1, s=2, m=3, t=1, and y=2, and its drivability is about 2.3 times as high as that of a single n-channel or p-channel transistor.

As can be seen, by forming the driver circuits 10 and 20 with the parameters in FIG. 3 changed as appropriate, driver circuits (semiconductor integrated circuits) with a desired degree of drivability are provided.

In the examples illustrated in FIG. 4, the drivability of the driver circuit 10 or 20 is supposed to be greater than that of a single n-channel or p-channel transistor. It is also possible to provide the driver circuit 10 or 20, of which the drivability is equal to or less than that of a single n-channel or p-channel transistor by setting the values of at least one of n, s, m, t, and y to be different from those in FIG. 4.

Optionally, a semiconductor integrated circuit device may be formed by implementing the respective driver circuits 10 and 20 shown in FIG. 4 as cells and by combining any of those cells of the driver circuits 10 and 20 with each other. This facilitates the design process of the circuit. In addition, the arrangement of the elements (layout configuration) in the driver circuit is known in advance, thus causing only a minimum difference in layout among the driver circuits with the same drivability. This allows for reducing a variation in characteristics between the driver circuits.

Figure 6:
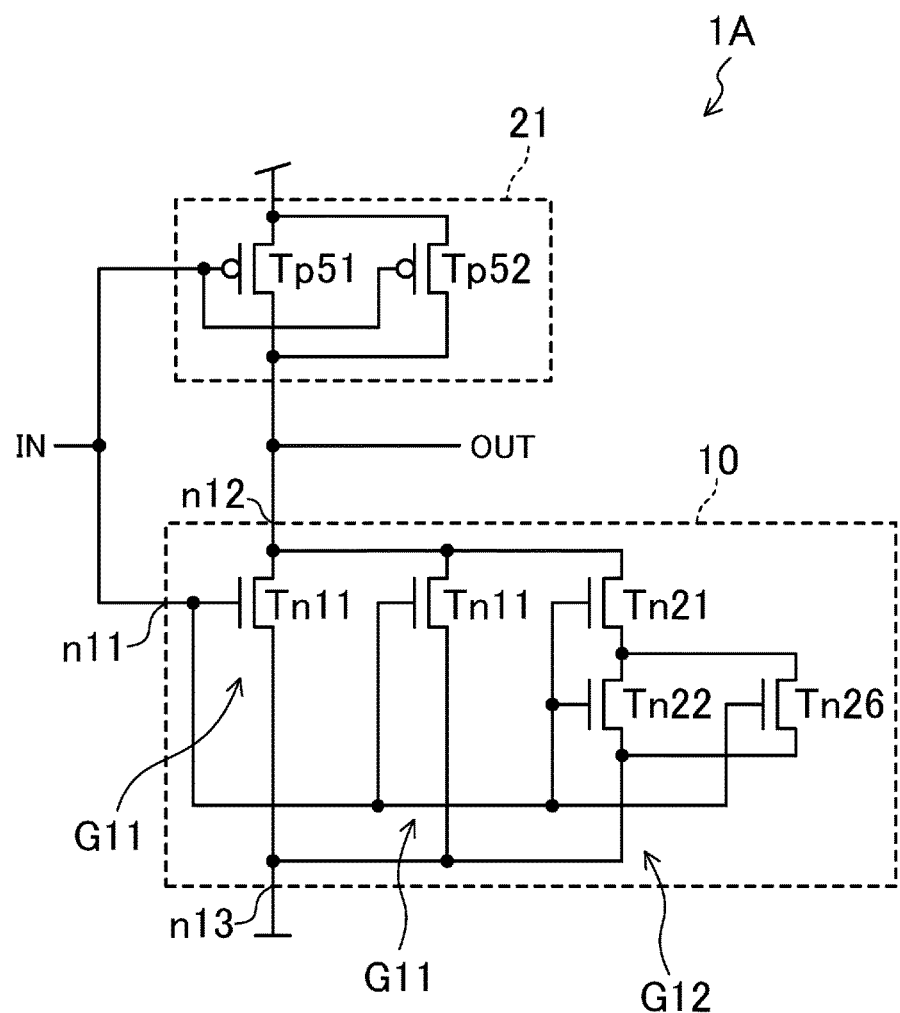
FIG. 6 conceptually illustrates still yet another exemplary circuit configuration of a semiconductor integrated circuit device according to the first embodiment.
Figure 7:
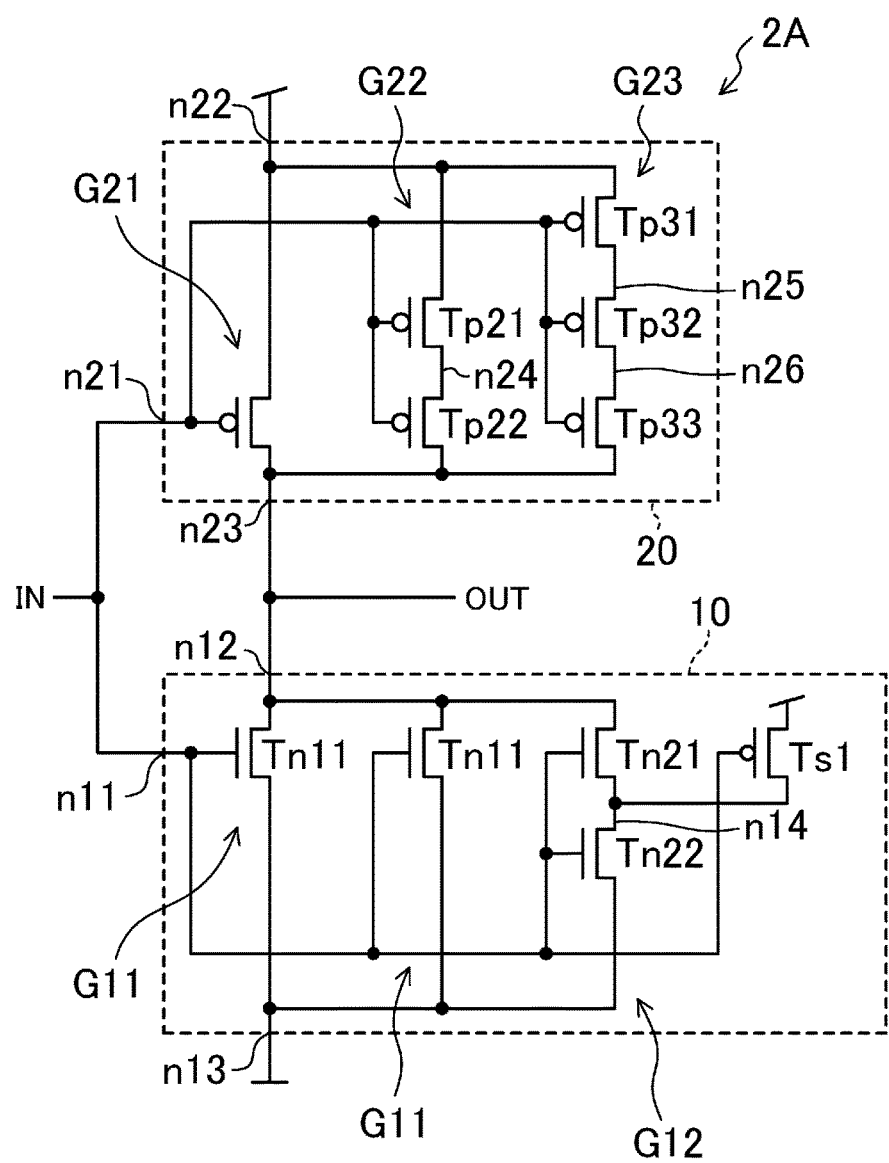
FIG. 7 conceptually illustrates an exemplary circuit configuration of a semiconductor integrated circuit device according to a second embodiment.

In the examples illustrated in FIGS. 1 and 2, the inverter circuit is supposed to be formed by combining the driver circuits 10 and 20 according to this embodiment. However, this is only an exemplary embodiment of the present disclosure. For example, as illustrated in FIGS. 5-7, another semiconductor integrated circuit (driver circuit) may be combined with the driver circuit 10 according to this embodiment.

Figure 5:
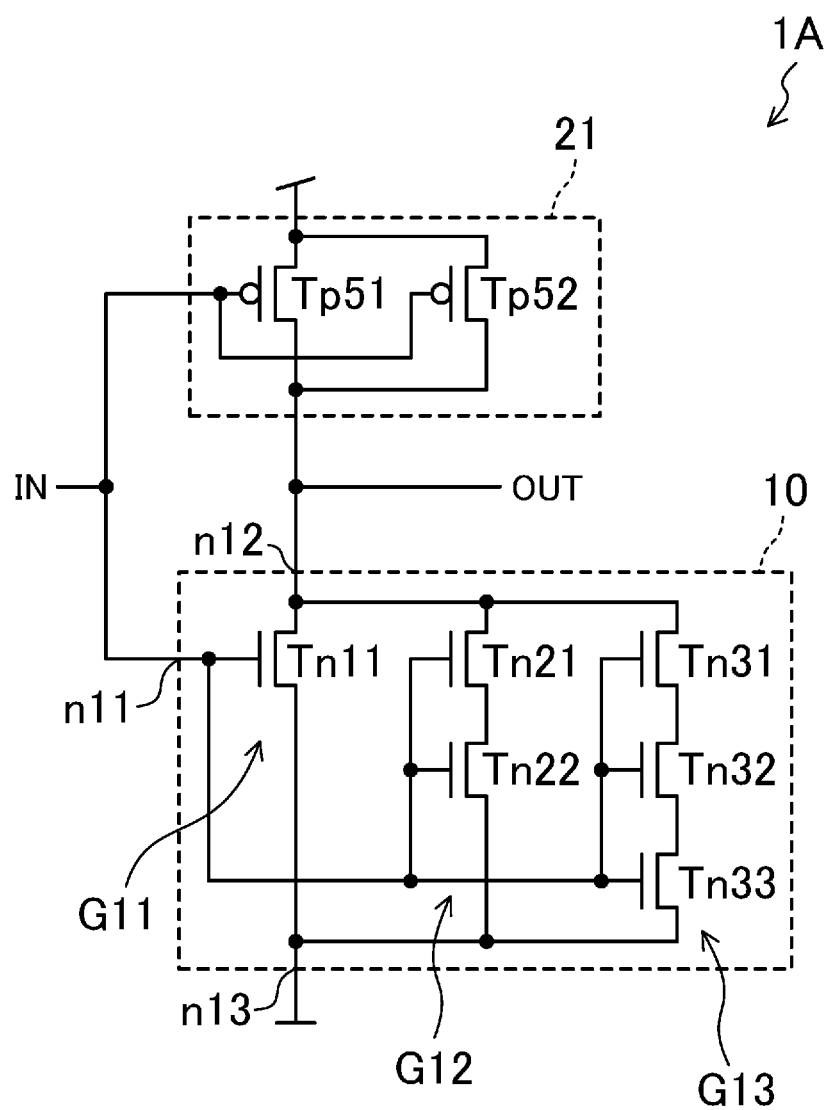
FIG. 5 conceptually illustrates yet another exemplary circuit configuration of a semiconductor integrated circuit device according to the first embodiment.

Specifically, the semiconductor integrated circuit device 1A illustrated in FIG. 5 includes a driver circuit 21 instead of the driver circuit 20 of FIG. 1.

The driver circuit 21 includes two p-channel transistors Tp51 and Tp52 connected together in parallel between the power supply and the output node OUT. The respective gates of the p-channel transistors Tp51 and Tp52 are both connected to the input node IN.

In FIGS. 1 and 2, a driver circuit other than the driver circuit 10 may be combined as in FIG. 5 with the driver circuit 20, although this is not illustrated.

The semiconductor integrated circuit device 1A illustrated in FIG. 6 includes the driver circuit 21 instead of the driver circuit 20 of FIG. 2. The driving circuit 10 includes, in addition to the elements illustrated in FIG. 2, an n-channel transistor Tn26 connected in parallel to the n-channel transistor Tn22. The gate of the n-channel transistor Tn26 is connected to the input node n11.

This allows for controlling the drivability of the driver circuit 10 more finely. Also, this allows for reducing the number of the transistors that needs to be provided to obtain a desired degree of drivability. Consequently, the circuit may exhibit a desired degree of drivability in a smaller area.

In the example illustrated in FIG. 6, a single n-channel transistor Tn26 is connected in parallel to the n-channel transistor Tn22. However, this is only an exemplary embodiment of the present disclosure. For example, q n-channel transistors (where q≥1) connected together in series may be connected in parallel to the n-channel transistor Tn22.

Alternatively, the n-channel transistor Tn26 may also be connected in parallel to a plurality of n-channel transistors connected together in series. Specifically, in FIG. 1, for example, the n-channel transistor Tn26 may be connected between the node n12 and the intermediate node n16 between the n-channel transistors Tn 32 and Tn33 (not illustrated). In this case, the n-channel transistor Tn26 is connected in parallel to the n-channel transistors Tn31 and Tn32.

Also, in a driver circuit (for example, the driver circuit 20) including p-channel transistors, the transistor(s) also may be connected in parallel in the same or similar manner as/to the above circuit, and the same or similar advantage may also be achieved.

Second Embodiment

FIG. 7 conceptually illustrates an exemplary circuit configuration of a semiconductor integrated circuit device 2A according to a second embodiment.

The semiconductor integrated circuit device 2A illustrated in FIG. 7 includes, in addition to the elements of the semiconductor integrated circuit device 1A of FIG. 2, a p-channel precharge transistor Ts1 in the driver circuit 10.

Specifically, the precharge transistor Ts1 is connected between the power supply and the intermediate node n14 connecting together two n-channel transistors Tn21 and Tn22 in the transistor group G12. The gate of the precharge transistor Ts1 is connected to the input node n11.

It will be described in detail how the semiconductor integrated circuit device 2A (the precharge transistor Ts1) operates.

In the semiconductor integrated circuit device 2A, if an input signal supplied from the input node IN (input node n11) is low, i.e., if the n-channel transistors Tn21 and Tn22 are in OFF state, the precharge transistor Ts1 turns ON and the voltage at the intermediate node n14 is precharged to the level of the power supply voltage. On the other hand, if the input signal supplied from the input node IN (input node n11) is high, i.e., if the n-channel transistors Tn21 and Tn22 are in ON state, the precharge transistor Ts1 turns OFF and the precharge is cancelled.

As can be seen, even if the n-channel transistors Tn21 and Tn22 are in OFF state, the voltage at the intermediate node n14 is still precharged to the level of the power supply voltage. This thus allows for reducing a variation in delay in the interval between the reception of the input signal at the input node IN and the delivery of an output signal through the output node OUT.

The precharge transistor Ts1 does not have to be connected only to the intermediate node n14. For example, in FIG. 1, the precharge transistor Ts1 may also be connected to the intermediate node n15 connecting together the two n-channel transistors Tn31 and Tn32 of the transistor group G13 in the driver circuit 10. Likewise, the precharge transistor Ts1 may also be connected to the intermediate node n16 connecting together the two n-channel transistors Tn32 and Tn33 of the transistor group G13.

Also, the precharge voltage does not have to be as high as the supply voltage level but may also be higher than the ground voltage level and lower than the supply voltage level. Or by reducing the drivability by adjusting the gate width and/or gate length of the precharge transistor and/or the number of transistors connected together in series, the leakage current may be reduced. Even in such a case, the same or similar advantage as/to that of the semiconductor integrated circuit device 2A illustrated in FIG. 7 may also be achieved.

The precharge transistor Ts1 does not have to be connected only to the intermediate node in the driver circuit 10. For example, in FIG. 7, the precharge transistor Ts1 may also be connected to the intermediate node n24 connecting together the two p-channel transistors Tp21 and Tp22 of the transistor group G22 in the driver circuit 20. In this case, an n-channel transistor, for example, may be used as the precharge transistor Ts1. Specifically, in that case, the precharge transistor Ts1 (the n-channel transistor) may be connected between the intermediate node n24 and the ground, and may have its gate connected to the input node n21 (not illustrated). Even in this case, the same or similar advantage as/to that of the semiconductor integrated circuit device 2A illustrated in FIG. 7 may also be achieved.

Likewise, the above precharge transistor Ts1 (the n-channel transistor) may also be connected to the intermediate node n25 connecting together the two p-channel transistors Tp31 and Tp32 in the transistor group G23, or to the intermediate node n26 connecting together the two p-channel transistors Tp32 and Tp33 in the transistor group G23.

Third Embodiment

Figure 8:
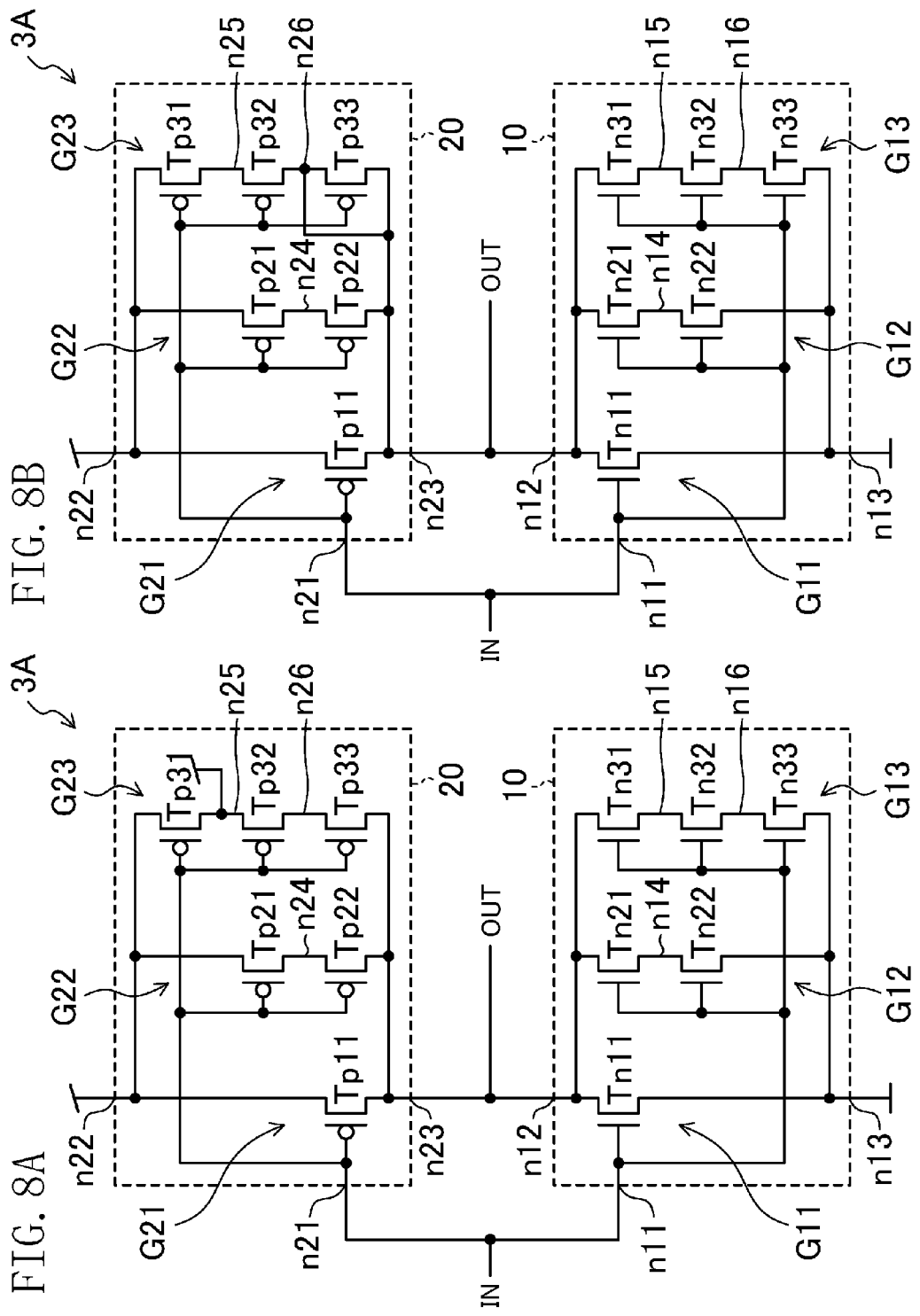
FIGS. 8A and 8B each conceptually illustrate an exemplary circuit configuration of a semiconductor integrated circuit device according to a third embodiment.

FIGS. 8A and 8B each conceptually illustrate an exemplary circuit configuration of a semiconductor integrated circuit device 3A according to a third embodiment.

The semiconductor integrated circuit device 3A illustrated in FIG. 8A is the same as the semiconductor integrated circuit device 1A illustrated in FIG. 1, except that the intermediate node n25 connecting together the two p-channel transistors Tp31 and Tp32 of the transistor group G23 in the driver circuit 20 is connected to the power supply functioning as a constant voltage source.

Thus, the source and drain of the p-channel transistor Tp31 are substantially short-circuited together, and the drivability of the transistor group G23 becomes half that of the transistor group G21. Accordingly, the drivability of the driver circuit 20 becomes twice that of the p-channel transistor Tp11.

Likewise, the semiconductor integrated circuit device 3A illustrated in FIG. 8B the semiconductor integrated circuit device 1A illustrated in FIG. 1, except that the intermediate node n26 connecting together the two p-channel transistors Tp32 and Tp33 of the transistor group G23 in the driver circuit 20 is connected to the node 23.

Thus, the source and drain of the p-channel transistor Tp33 are substantially short-circuited together, and the drivability of the transistor group G23 becomes half that of the transistor group G21. Accordingly, the drivability of the driver circuit 20 becomes twice that of the p-channel transistor Tp11.

In the driver circuit 10, its drivability may also be controlled in the same or similar manner as/to the above embodiment. Specifically, for example, the intermediate node n16 connecting together the n-channel transistors Tn32 and Tn33 of the transistor group G13 in the driver circuit 10 may also be connected to the ground functioning as a constant voltage source (not illustrated). Accordingly, as in FIG. 8A, the drivability of the driver circuit 10 becomes twice that of the n-channel transistor Tn11.

Optionally, the intermediate node n15 connecting together the two n-channel transistors Tn31 and Tn32 of the transistor group G13 in the driver circuit 10 may also be connected to the node n12. Accordingly, as in FIG. 8B, the drivability of the driver circuit 10 becomes twice that of the n-channel transistor Tn11.

As can be seen, this embodiment enables the semiconductor integrated circuit device 3A to control the drivabilities of the driver circuits 10 and 20 while setting the number of the n-channel transistors forming the driver circuit 10 to be the same as that of the p-channel transistors forming the driver circuit 20. This allows for making the patterns of gates and diffusion layers uniform. Consequently, a dispersion in performance between semiconductor integrated circuit devices (driver circuits) and between devices including such a semiconductor integrated circuit device may be reduced.

Optionally, an intermediate node connecting together two transistors of a transistor group in a driver circuit may be provided in advance with a contact and a metallic interconnect which is not connected to any interconnect. In that case, even in a situation where the drivability needs to be controlled by modifying the mask, the drivability may be controlled only by modifying the metallic interconnect layer without changing the gate layer and diffusion layer.

Specifically, in FIG. 8A, for example, the intermediate node n26 connecting together the p-channel transistors Tp32 and Tp33 in the transistor group G23 may be provided with the contact and metallic interconnect. If it is necessary to control (increase) the drivability of the driver circuit 20, mask modification is performed in which this metallic interconnect is connected to the power supply or node n23. Also, in order to decrease the drivability, for example, mask modification may also be performed in which the intermediate node n25 is disconnected from the power supply in FIG. 8A.

An exemplary modified connection of the intermediate node has been described as a variation. Another intermediate node or another intermediate node in another transistor group may also be connected in the same or similar manner, and the same or similar advantage as/to that of this embodiment may also be achieved.

Fourth Embodiment

Figure 9:
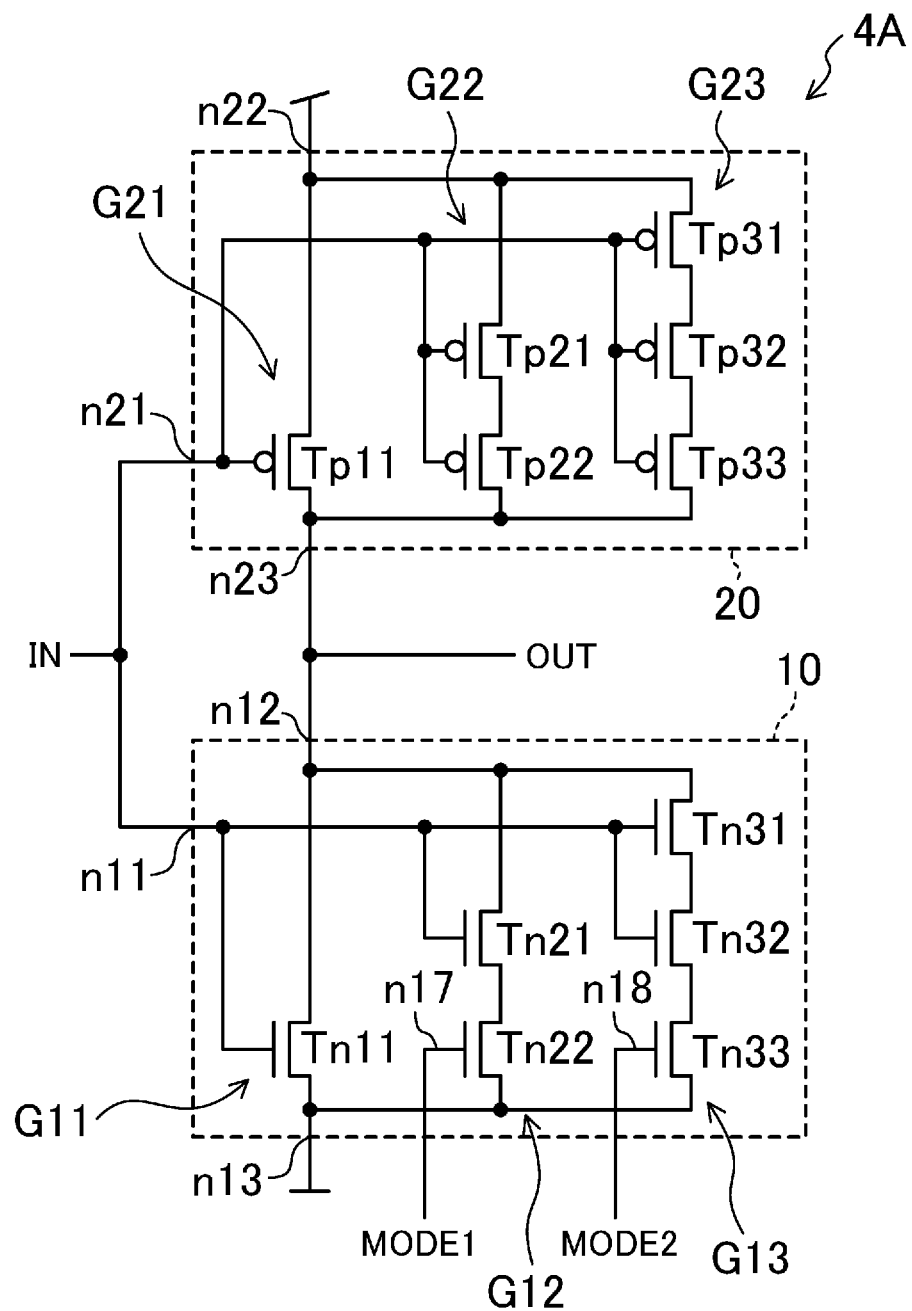
FIG. 9 conceptually illustrates an exemplary circuit configuration of a semiconductor integrated circuit device according to a fourth embodiment.

FIG. 9 conceptually illustrates an exemplary circuit configuration of a semiconductor integrated circuit device 4A according to a fourth embodiment.

The semiconductor integrated circuit device 4A illustrated in FIG. 9 is the same as the semiconductor integrated circuit device 1A illustrated in FIG. 1, except that in the driver circuit 10, the gate of the n-channel transistor Tn22 in the transistor group G12 is not connected to the input node n11 but connected to a control node n17 supplying a mode control signal MODE1, and the gate of the n-channel transistor Tn33 in the transistor group G13 is not connected to the input node n11 but connected to a control node n18 supplying a mode control signal MODE2. The mode control signal MODE1 is a control signal controlling the ON/OFF states of the n-channel transistor Tn22, and the mode control signal MODE2 is a control signal controlling the ON/OFF states of the n-channel transistor Tn33.

It will be described in detail how to control the drivability of the driver circuit 10 using the mode control signals MODE1 and MODE2.

If the mode control signals MODE1 and MODE2 are both high, both of the n-channel transistors Tn22 and Tn33 turn ON, and are brought into a conductive state. Accordingly, as in the driver circuit 10 of FIG. 1, the drivability of the driver circuit 10 becomes about 1.8 times as high as that of the n-channel transistor Tn11.

On the other hand, if the mode control signal MODE1 is high and the mode control signal MODE2 is low, the n-channel transistor Tn22 turns ON but the n-channel transistor Tn33 turns OFF. As a result, the transistor group G13 is brought into a non-conductive state regardless of the input signal from the input node IN (input node n11). Accordingly, the drivability of the driver circuit 10 becomes 1.5 times as high as that of the n-channel transistor Tn11. Likewise, if the mode control signal MODE1 is low and the mode control signal MODE2 is high, the drivability of the driver circuit 10 becomes about 1.3 times as high as that of the n-channel transistor Tn11. If the mode control signals MODE1 and MODE2 are both low, the drivability of the driver circuit 10 becomes as high as that of the n-channel transistor Tn11.

In the driver circuit 20, its drivability may also be controlled in the same or similar manner as/to the above embodiment. Specifically, the drivability may be controlled by connecting a control node to the gates of some transistors of the respective transistor groups in the driver circuit 20 and by applying a mode control signal to those gates.

As can be seen, according to this embodiment, the drivability of the driver circuit may be controlled with mode control signals. This allows for controlling the transistors such that the mode control signals cause the transistors to turn ON if the driver circuit needs to operate at high rates and that the mode control signals cause the transistors to turn OFF to reduce the leakage current if the driver circuit may operate at low rates. That is to say, a tradeoff may be struck between the operating speed of the driver circuit and the leakage current. Such a circuit is useful for, e.g., a driver circuit of a memory cell power supply used as an aid for the operation of the memory.

Figure 10:
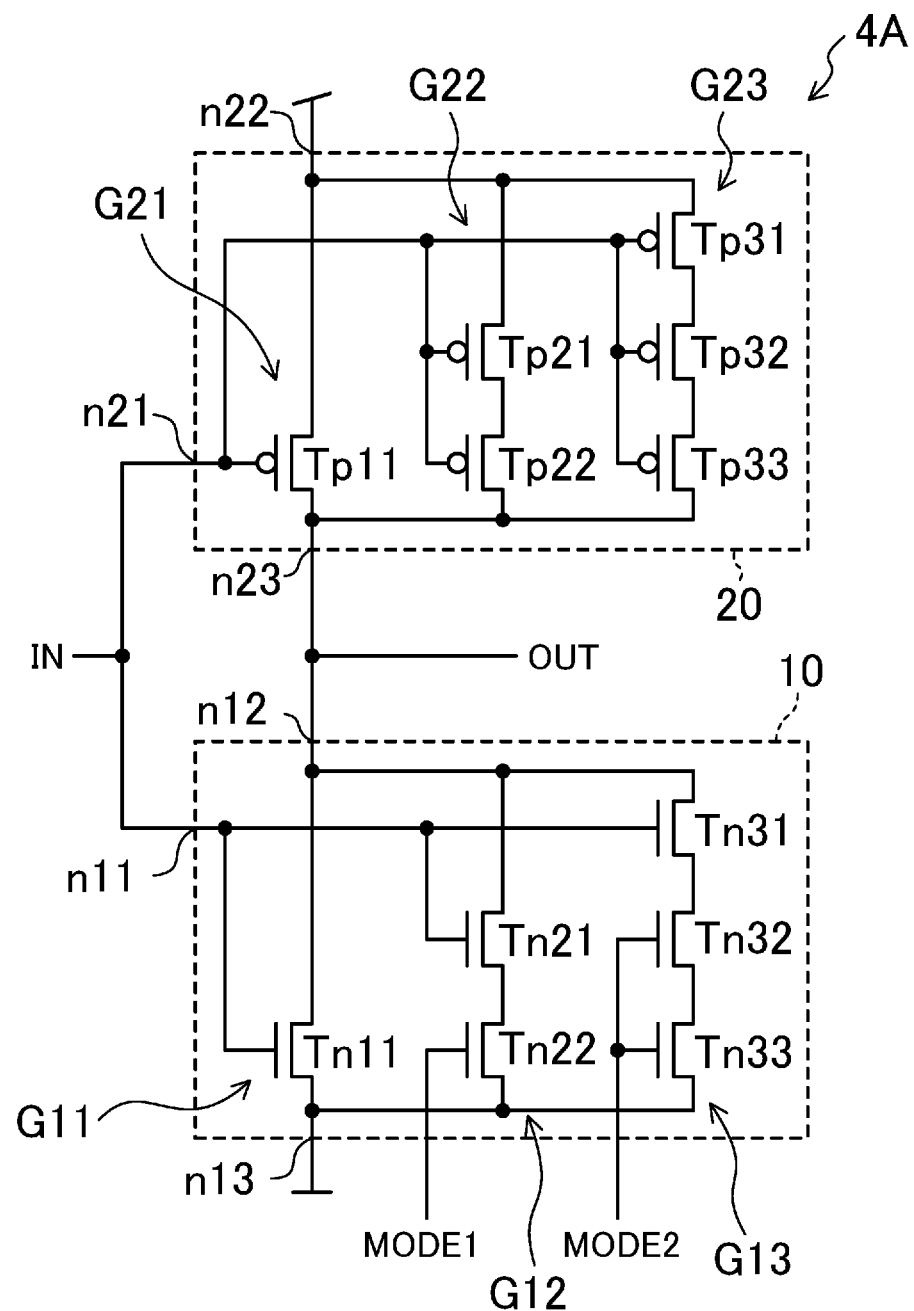
FIG. 10 conceptually illustrates another exemplary circuit configuration of a semiconductor integrated circuit device according to the fourth embodiment.

In FIG. 9, the mode control signal MODE2 is supplied to the one n-channel transistor Tn33 of the three n-channel transistors Tn31, Tn32, and Tn33 connected together in series in the transistor group G13. However, this is only an exemplary embodiment of the present disclosure. For example, as illustrated in FIG. 10, in the semiconductor integrated circuit device 4A, the mode control signal MODE2 may be supplied to the two n-channel transistors Tn32 and Tn33 of the three n-channel transistors Tn31, Tn32, and Tn33. Even in that case, the same or similar advantage may also be achieved. Furthermore, the semiconductor integrated circuit device 4A is capable of reducing a gate capacitance accompanying the input node n11 (input node IN) in the driver circuit 10 more significantly than the semiconductor integrated circuit devices in the other drawings do.

In FIGS. 9 and 10, the mode control signals MODE1 and MODE2 are supplied to the n-channel transistors. Instead of the mode control signals MODE1 and MODE2, the power supply may be connected to those n-channel transistors. This allows for not only achieving the same or similar advantage as/to that in the circuit of FIG. 1, but also reducing the gate capacitance accompanying the input node n21 (input node IN).

Alternatively, n-channel transistors supplied with the mode control signals and n-channel transistors connected to the power supply may be included in the same driver circuit as well.

The drivability of the semiconductor integrated circuit device does not have to be controlled using the mode control signals only inside of the driver circuit. For example, as illustrated in FIG. 11, the drivability may also be controlled using the mode control signals outside of the driver circuit.

Figure 11:
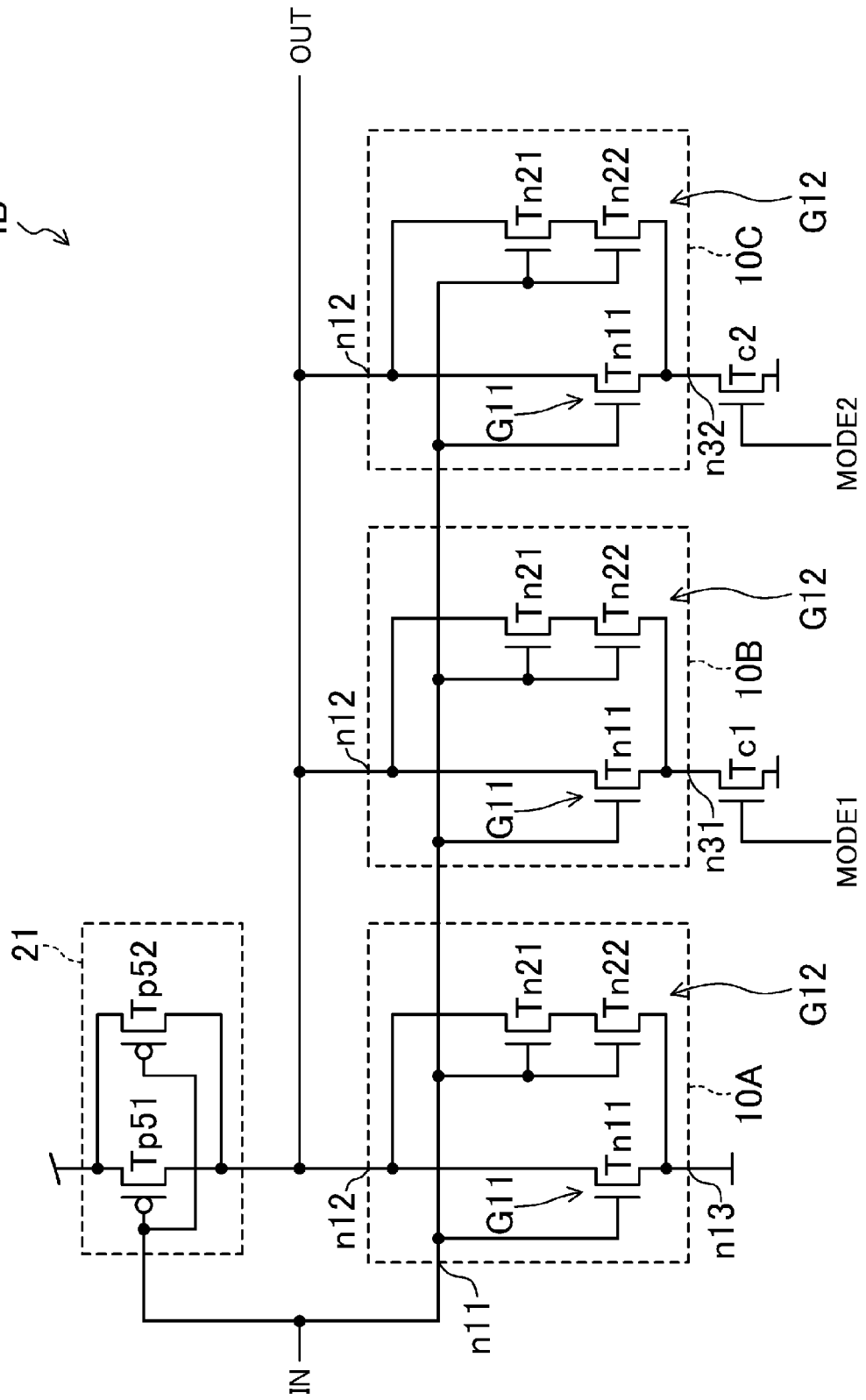
FIG. 11 conceptually illustrates yet another exemplary circuit configuration of a semiconductor integrated circuit device according to the fourth embodiment.

The semiconductor integrated circuit device 4B illustrated in FIG. 11 is configured as an inverter circuit including a driver circuit 21 connected between the power supply and the output node OUT, and three driver circuits 10A, 10B, and 10C connected together in parallel between the output node OUT and the ground. A mode control transistor Tc1 is connected between the driver circuit 10B and the ground via a node n31. Likewise, a mode control transistor Tc2 is connected between the driver circuit 10C and the ground via a node n32.

The driver circuit 21 includes, as in FIG. 5, two p-channel transistors Tp51 and Tp52 connected together in parallel between the power supply and the output node OUT. The respective gates of theirs are connected to the input node IN.

The driver circuits 10A, 10B, and 10C each include two transistor groups G11 and G12 connected together in parallel. The transistor groups G11 and G12 have the same or similar configurations as/to their counterparts shown in FIG. 1, and the detailed description thereof will be omitted herein.

The mode control transistor Tc1 selectively activates and deactivates the driver circuit 10B in response to the mode control signal MODE1. Likewise, the mode control transistor Tc2 selectively activates and deactivates the driver circuit 10C in response to the mode control signal MODE2. The mode control signals MODE1 and MODE 2 thus change the total drivability of the three driver circuits 10A, 10B, and 10C (the number of the driver circuits that are activated). Consequently, this allows for controlling the drivability of the overall semiconductor integrated circuit device 4B.

In FIG. 11, the semiconductor integrated circuit device 4B includes the three driver circuits 10A, 10B, and 10C connected together in parallel between the output node OUT and the ground. Alternatively, a plurality of driver circuits including p-channel transistors may be connected together in parallel between the power source and the output node OUT, and a mode control transistor may be connected to some or all of the driver circuits to activate and deactivate the driver circuits selectively.

Other Embodiments

The first to fourth embodiments have been described as mere examples of the technique disclosed in the present application. However, the technique of the present disclosure is not limited thereto but is readily implementable as various other embodiments by making combinations, modifications, substitutions, additions, and/or omissions as appropriate on the embodiments described above.

For example, the semiconductor integrated circuit device in each of FIGS. 1-11 has been described as an inverter circuit. However, this is only an exemplary embodiment of the present disclosure. For example, the semiconductor integrated circuit (the driver circuit) may also be applied to other fundamental gates, such as AND, NAND, OR, NOR, Exclusive-OR (EOR), and Exclusive-NOR (ENOR) circuits, and composite gates. Alternatively, the semiconductor integrated circuit (the driver circuit) may also be applied to other semiconductor integrated circuit devices such as memory cells and dynamic circuits.

Figure 12:
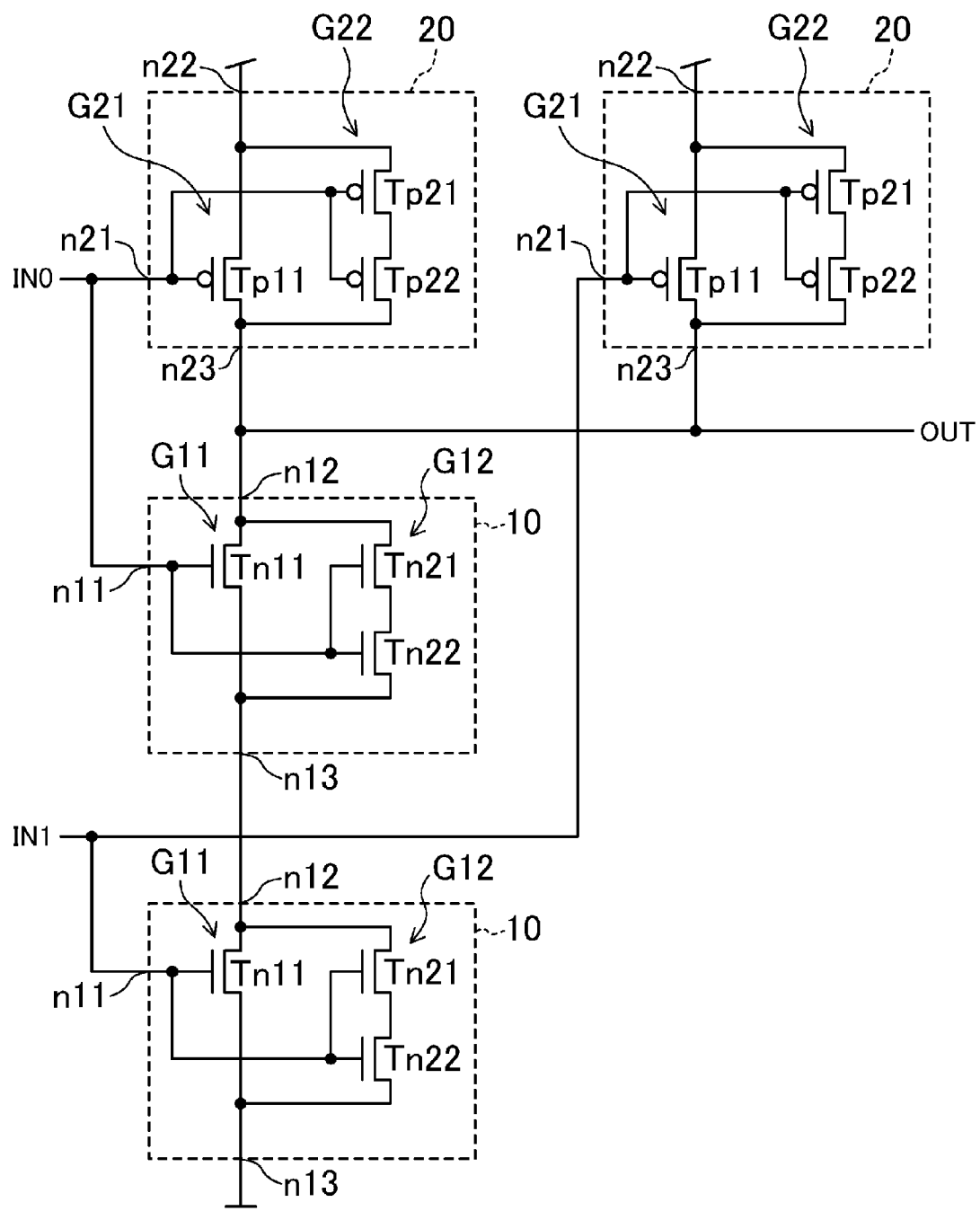
FIG. 12 conceptually illustrates an exemplary circuit configuration of a semiconductor integrated circuit device according to another embodiment.

FIG. 12 illustrates an example where the driver circuits 10 and 20 according to the present disclosure are applied to a NAND circuit. In FIG. 12, a semiconductor integrated circuit device 5A (a NAND circuit) includes two driver circuits 20 and 20 connected together in parallel between the power supply and the output node OUT, and two driver circuits 10 and 10 connected together in series between the output node OUT and the ground. That is to say, the node n22 of each driver circuit 20 is connected to the power supply, and the node 23 of each driver circuit 20 is connected to the output node OUT. Also, the node n12 of one driver circuit 10 (the upper driver circuit 10 on the paper) is connected to the output node OUT, and the node n13 thereof is connected to the node n12 of the other driver circuit 10 (the lower driver circuit 10 on the paper). The node n13 of the other driver circuit 10 is connected to the ground.

One input node IN0 of the semiconductor integrated circuit device 5A is connected to the input node n21 of one driver circuit 20 and the input node n11 of one driver circuit 10. The other input node IN1 of the semiconductor integrated circuit device 5A is connected to the input node n21 of the other driver circuit 20 and the input node n11 of the other driver circuit 10.

The driver circuits 10 each include two transistor groups G11 and G12 connected together in parallel. Likewise, the driver circuits 20 each include two transistor groups G21 and G22 connected together in parallel. The transistor groups G11, G12, G21, and G22 have the same or similar configurations as/to their counterparts in FIG. 1, and the detailed description thereof will be omitted herein.

Figure 13:
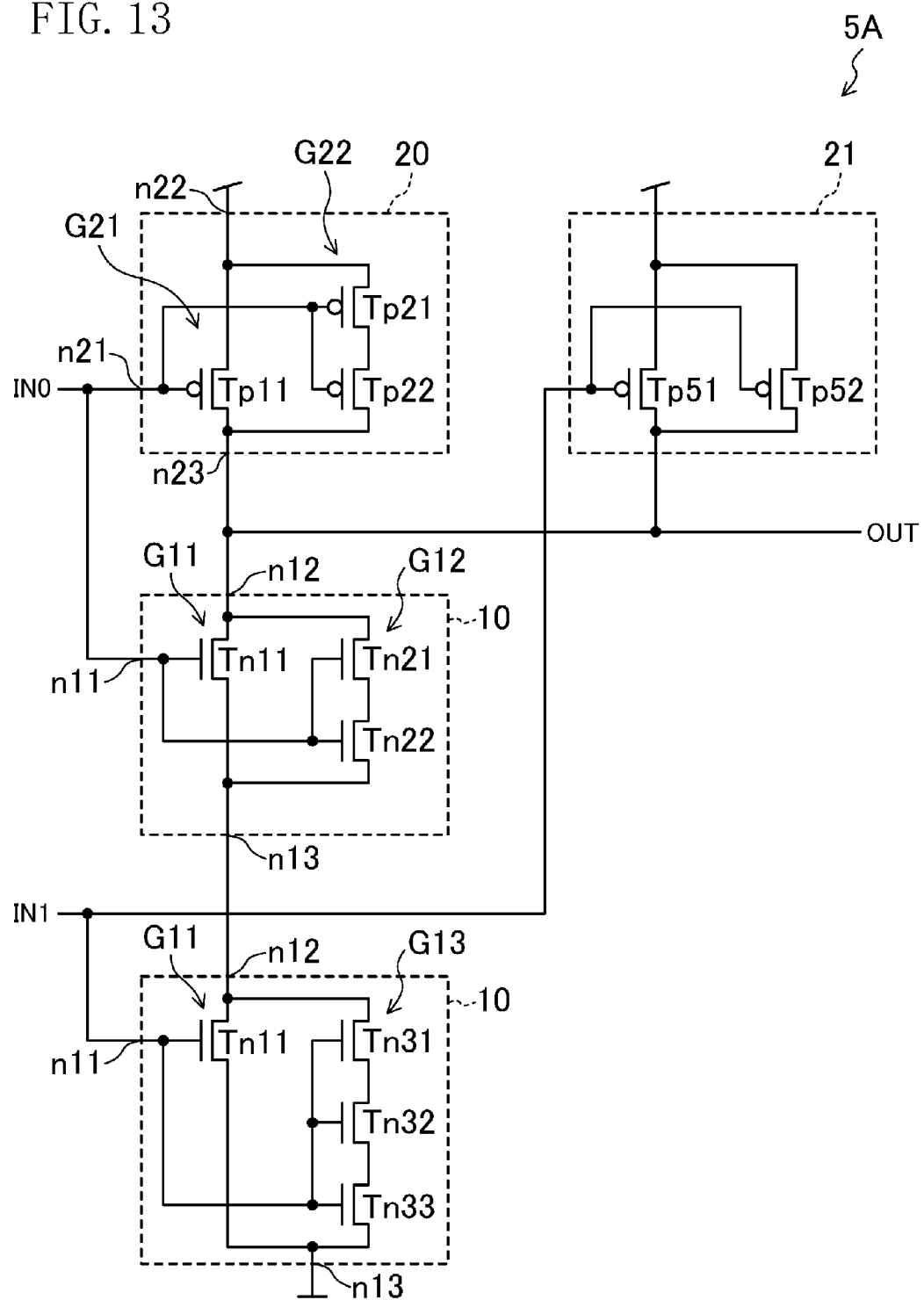
FIG. 13 conceptually illustrates another exemplary circuit configuration of a semiconductor integrated circuit device according to another embodiment.

FIG. 13 illustrates another example where the driver circuits 10 and 20 according to the present disclosure are applied to a NAND circuit. The semiconductor integrated circuit device 5A illustrated in FIG. 13 includes, in the driver circuit 10 at the lower side on the paper, a transistor group G13 instead of the transistor group G12. The semiconductor integrated circuit device 5A illustrated in FIG. 13 also includes a driver circuit 21 that is the same or similar as/to the counterpart in FIG. 5 instead of the driver circuit 20 at the right side on the paper. As can be seen, as well as the inverter circuit, a NAND circuit may be formed by combining driver circuits with different configurations.

Figure 14:
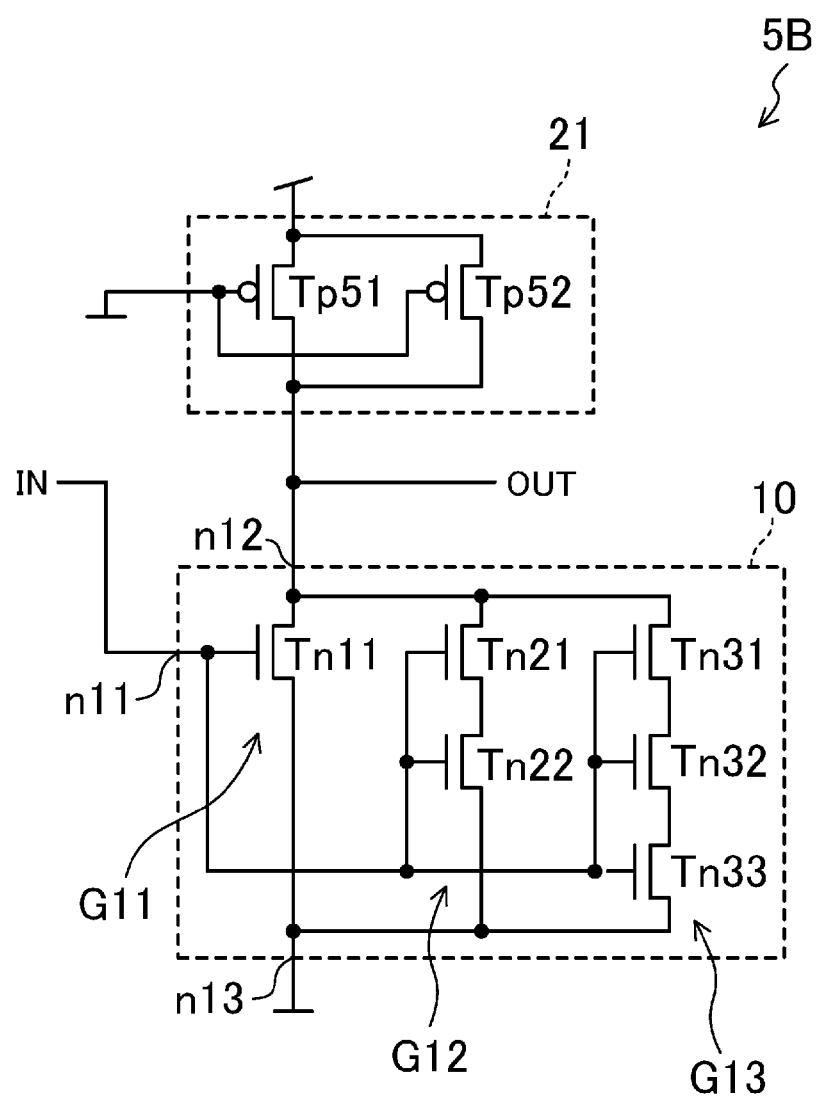
FIG. 14 conceptually illustrates yet another exemplary circuit configuration of a semiconductor integrated circuit device according to another embodiment.
Figure 15:
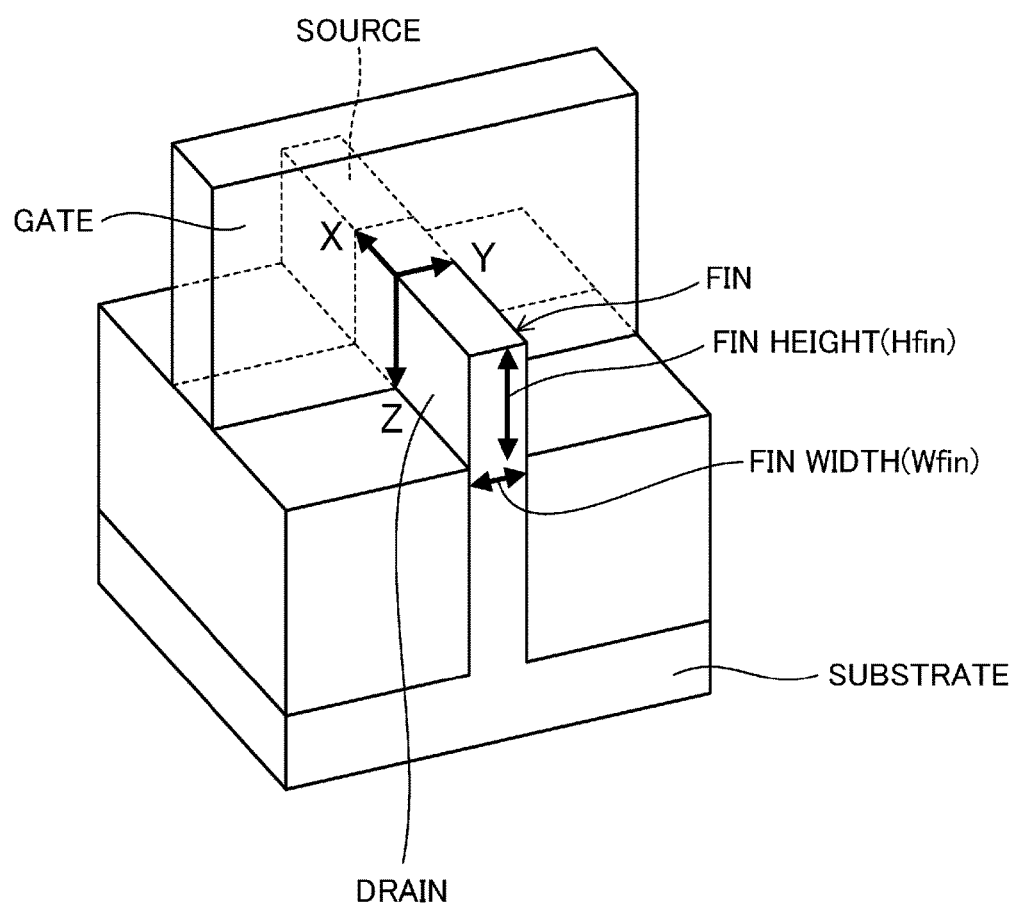
FIG. 15 illustrates the structure of a fin transistor.

Also, as illustrated in FIG. 14, the driver circuits according to the present disclosure may be applied to a bias regulator 5B functioning as a bias-regulating semiconductor integrated circuit device.

Specifically, the bias regulator 5B illustrated in FIG. 14 includes the driver circuits 10 and 21 as in FIG. 5. The driver circuit 21 includes two p-channel transistors Tp51 and Tp52 connected together in parallel between the power supply and the output node OUT. Their gates are both connected to the ground. The driver circuit 10 has the same configuration as that shown in FIG. 5, and the detailed description thereof will be limited herein.

It will now be described in detail how the bias regulator 5B operates.

In the bias regulator 5B, if an input signal supplied from the input node IN (the input node n11) is low, i.e., if the n-channel transistors Tn11, Tn21, Tn22, and Tn31-Tn33 in the driver circuit 10 are in OFF state, a supply voltage is output from the output node OUT. On the other hand, if an input signal supplied from the input node IN (the input node n11) is high, the n-channel transistors Tn11, Tn21, Tn22, and Tn31-Tn33 in the driver circuit 10 turn ON, and the supply voltage is divided by the driver circuits 21 and 10, and is output from the output node OUT. Changing the drivability of the driver circuit 10 allows for regulating the voltage level of the output signal to be output from the output node OUT.

As can be seen, the bias regulator 5B illustrated in FIG. 14 is capable of regulating the voltage of the output signal to be output from the output node OUT to any desired level. Thus, this bias regulator 5B is useful for, e.g., semiconductor integrated circuit devices which require fine regulation of its bias voltage. Specifically, for example, it is useful when voltage levels of memory cells need to be finely regulated in providing writing or reading aid for the memory cells.

The same or similar advantage may also be achieved even if the p-channel transistors Tp51 and Tp52 in the driver circuit 21 in FIG. 14 are replaced with n-channel transistors and their gates are connected to the power supply.

In FIG. 14, the driver circuit 21 including the p-channel transistors is supposed to be kept ON continuously. However, this is only an exemplary embodiment of the present disclosure. The same or similar advantage may also be achieved even if in FIG. 1, for example, the n-channel transistors Tn11, Tn21, Tn22, and Tn31-Tn33 in the driver circuit 10 are connected to the power supply to keep them ON continuously.

The same or similar advantage may also be achieved even if in FIG. 1, for example, all the n-channel transistors Tn11, Tn21, Tn22, and Tn31-Tn33 in the driver circuit 10 are replaced with p-channel transistors and their respective gates are connected to the ground.

A semiconductor integrated circuit according to the present disclosure is capable of controlling its drivability even if transistors therein have a fixed gate width and a fixed gate length. Thus, it is useful for, e.g., semiconductor integrated circuit devices including fundamental gates (such as inverters, NAND circuits and OR circuits), memory cells, and dynamic circuits.

What is claimed is:

1. A semiconductor integrated circuit device having a plurality of semiconductor integrated circuits which include a first semiconductor integrated circuit, the first semiconductor integrated circuit being connected to an input node and first and second nodes, wherein
the first semiconductor integrated circuit has a plurality of transistors, each of which has a first channel conductivity type and which are configured as fin transistors having the same gate length and the same gate width, the plurality of transistors comprising:
a first group of transistors provided between the first and second nodes and including n of the transistor(s) where n is an integer equal to or greater than one, the n transistors being connected together in series; and
a second group of transistors provided between the first and second nodes in parallel with the first group of transistors and including m of the transistor(s) where m is an integer equal to or greater than one and not equal to n, the m transistors being connected together in series,
the semiconductor integrated circuit device further having a control transistor whose source or drain is connected to the first or second node and which is connected in series to the first semiconductor integrated circuit,
all of the n transistor(s) in the first group and all of the m transistor(s) in the second group have their gate connected to the input node,
the control transistor is supplied, at its gate, with a mode control signal controlling ON/OFF states of the control transistor.

2. The semiconductor integrated circuit device of claim 1, wherein the plurality of transistors further comprises a third group of transistors provided in parallel with the first group of transistors between the first and second nodes and including n of the transistors connected together in series.

3. The semiconductor integrated circuit device of claim 1, wherein the second group of transistors further includes, in addition to the m transistors where m is equal to or greater than two, another transistor of the first channel conductivity type connected in parallel with some of the m transistors.

4. The semiconductor integrated circuit device of claim 1, wherein the second group of transistors further includes a precharge transistor connected to at least one of intermediate nodes connecting together associated ones of the m transistors where m is equal to or greater than two, and configured to precharge the at least one of the intermediate nodes to a predetermined voltage when the at least one of the m transistor(s) having their gate connected to the input node is in OFF state.

5. The semiconductor integrated circuit device of claim 1, wherein in the second group of transistors, a constant voltage power supply or the first or second node is connected to at least one of intermediate nodes connecting together associated ones of the m transistors where m is equal to or greater than two.

6. The semiconductor integrated circuit device of claim 1, wherein the plurality of the semiconductor integrated circuits form a fundamental gate.

7. The semiconductor integrated circuit device of claim 1, wherein the first semiconductor integrated circuit includes a plurality of the first semiconductor integrated circuits having respectively different configurations.

* * * * *